United States Patent
Lim et al.

(10) Patent No.: US 12,268,246 B2
(45) Date of Patent: Apr. 8, 2025

(54) DEVICE AND METHOD FOR GENERATING AEROSOL

(71) Applicant: KT&G CORPORATION, Daejeon (KR)

(72) Inventors: Hun Il Lim, Seoul (KR); Tae Hun Kim, Yongin-si (KR); Hyung Jin Jung, Seoul (KR); Jae Sung Choi, Hanam-si (KR); Jung Ho Han, Daejeon (KR)

(73) Assignee: KT&G CORPORATION, Daejeon (KR)

( * ) Notice: Subject to any disclaimer, the term of this patent is extended or adjusted under 35 U.S.C. 154(b) by 1102 days.

(21) Appl. No.: 16/965,221

(22) PCT Filed: Nov. 7, 2019

(86) PCT No.: PCT/KR2019/015076
§ 371 (c)(1),
(2) Date: Jul. 27, 2020

(87) PCT Pub. No.: WO2020/149503
PCT Pub. Date: Jul. 23, 2020

(65) Prior Publication Data
US 2020/0367568 A1     Nov. 26, 2020

(30) Foreign Application Priority Data
Jan. 16, 2019   (KR) .................. 10-2019-0005861

(51) Int. Cl.
*A24F 40/51*   (2020.01)
*A24F 40/42*   (2020.01)
(Continued)

(52) U.S. Cl.
CPC .............. *A24F 40/53* (2020.01); *A24F 40/42* (2020.01); *A24F 40/51* (2020.01); *A24F 40/10* (2020.01)

(58) Field of Classification Search
None
See application file for complete search history.

(56) References Cited

U.S. PATENT DOCUMENTS

| 10,308,034 | B2 | 6/2019 | Usui et al. |
| 2018/0177238 | A1* | 6/2018 | Bessant ................ G01C 9/18 |

(Continued)

FOREIGN PATENT DOCUMENTS

| JP | 2017-189954 A | 10/2017 |
| KR | 10-1820847 B1 | 1/2018 |

(Continued)

OTHER PUBLICATIONS

Office Action dated Dec. 13, 2022 from the China National Intellectual Property Administration in Application No. 201980006128.X.

(Continued)

*Primary Examiner* — Katherine A Will
(74) *Attorney, Agent, or Firm* — Sughrue Mion, PLLC

(57) ABSTRACT

Provided is an aerosol generating device including: a cartomizer including a cartridge configured to store an aerosol generating material and an atomizer configured to vaporize the aerosol generating material; at least one pair of electrodes arranged in positions contacting one side of the cartridge; and a sensor configured to measure capacitance of the electrodes to detect a remaining amount of the aerosol generating material.

10 Claims, 9 Drawing Sheets

(51) Int. Cl.
*A24F 40/53* (2020.01)
*A24F 40/10* (2020.01)

(56) References Cited

U.S. PATENT DOCUMENTS

| | | |
|---|---|---|
| 2018/0242644 A1 | 8/2018 | Bessant et al. |
| 2018/0338537 A1 | 11/2018 | Yan et al. |

FOREIGN PATENT DOCUMENTS

| | | |
|---|---|---|
| KR | 10-2018-0011812 A | 2/2018 |
| KR | 10-2018-0053649 A | 5/2018 |
| KR | 10-2018-0111806 A | 10/2018 |
| WO | 2017/045897 A1 | 3/2017 |
| WO | 2017/051011 A1 | 3/2017 |
| WO | 2017/137505 A1 | 8/2017 |
| WO | 2017/137510 A1 | 8/2017 |
| WO | 2018/114849 A1 | 6/2018 |
| WO | 2018/158081 A1 | 9/2018 |

OTHER PUBLICATIONS

International Search Report for PCT/KR2019/015076 dated Feb. 12, 2020 [PCT/ISA/210].
Written Opinion for PCT/KR2019/015076 dated Feb. 12, 2020 [PCT/ISA/237].
Extended European Search Report dated Aug. 13, 2021, issued by the European Patent Office in application No. 19909994.6.
Communication dated Jul. 6, 2021, issued by the Japanese Patent Office in application No. 2020-536059.
Chinese Office Action dated May 27, 2023 in Chinese Application No. 201980006128.X.

\* cited by examiner

FIG. 11

```
START
  ↓
MEASURE CAPACITANCE OF AT LEAST ONE PAIR OF
ELECTRODES ARRANGED IN POSITIONS CONTACTING      — 1110
ONE SIDE OF CARTRIDGE STORING AEROSOL
GENERATING MATERIAL
  ↓
DETECT REMAINING AMOUNT OF AEROSOL               — 1120
GENERATING MATERIAL FROM CAPACITANCE
  ↓
CONTROL POWER SUPPLIED TO ATOMIZER VAPORIZING
AEROSOL GENERATING MATERIAL ON BASIS OF          — 1130
REMAINING AMOUNT
  ↓
END
```

DEVICE AND METHOD FOR GENERATING AEROSOL

TECHNICAL FIELD

The present disclosure relates to a device and method for generating aerosol, and more particularly, to aerosol generating device and method for detecting a remaining amount of an aerosol generating material by measuring capacitance of electrodes arranged on a side of a cartridge.

BACKGROUND ART

Recently, the demand for alternative methods of overcoming the shortcomings of traditional cigarettes has increased. For example, there is growing demand for a method of generating aerosol by heating a liquid aerosol generating material, rather than by combusting cigarettes. Accordingly, studies on aerosol generating devices for heating liquid aerosol generating materials have been actively conducted.

An aerosol generating device may generate aerosol by heating a liquid aerosol generating material stored in a cartridge. For an aerosol generating device to normally operate, an amount of an aerosol generating material remaining in a cartridge may need to be detected.

If the remaining amount of the aerosol generating material is not detected, a user cannot confirm whether the aerosol generating device is available, which causes inconvenience to a user. Also, since the required degree to which the aerosol generating material is heated may be different according to the remaining amount, the provision of aerosol may be not uniform if the remaining amount is not detected.

Therefore, there is a need for a technique for informing a user of whether or not an aerosol generating device is usable and accurately measuring a remaining amount of an aerosol generating material to provide aerosol uniformly.

DESCRIPTION OF EMBODIMENTS

Technical Problem

Provided are a device and a method for generating aerosol. In addition to the technical problems related to the aerosol generating device and method, other technical problems may be inferred from the following embodiments.

Solution to Problem

According to an aspect of the present disclosure, an aerosol generating device may include: a cartomizer including a cartridge configured to store an aerosol generating material and an atomizer configured to vaporize the aerosol generating material; at least one pair of electrodes arranged in positions contacting one side of the cartridge; and a sensor configured to measure capacitance of the electrodes to detect a remaining amount of the aerosol generating material.

According to another aspect of the present disclosure, an aerosol generating method may include: measuring capacitance of at least one pair of electrodes arranged in positions contacting one side of a cartridge storing an aerosol generating material; detecting a remaining amount of the aerosol generating material from the capacitance; and controlling, on the basis of the remaining amount, power supplied to an atomizer vaporizing the aerosol generating material.

Advantageous Effects of Disclosure

A remaining amount of an aerosol generating material may be measured by measuring capacitance of at least one pair of electrodes arranged in positions contacting one side of a cartridge. In particular, the electrodes may be arranged on one side of the cartridge according to various arrangements, thereby improving the accuracy of measuring the remaining amount of the aerosol generating material.

As the remaining amount of the aerosol generating material may be accurately measured, a user may be provided with information about whether or not an aerosol generating device is usable. As such, user's convenience is increased. Also, since the aerosol generating device may adjust a degree of heating the aerosol generating material on the basis of the measured remaining amount, aerosol may be more uniformly provided from the aerosol generating device.

BRIEF DESCRIPTION OF DRAWINGS

FIG. 11 is a flowchart illustrating an example of an aerosol generating method.

BEST MODE

According to an aspect of the present disclosure, an aerosol generating device may include: a cartomizer including a cartridge storing an aerosol generating material and an atomizer vaporizing the aerosol generating material; at least one pair of electrodes arranged in positions contacting one side of the cartridge; and a sensor measuring capacitance of the electrodes to detect a remaining amount of the aerosol generating material.

Mode of Disclosure

Hereinafter, example embodiments will be described in detail with reference to the accompanying drawings. It should be understood that the following description is only for the purpose of embodying embodiments and does not limit or restrict the scope of the present disclosure. Matters that may be easily inferred by one of ordinary skill in the art from the detailed description and embodiments should be construed as pertaining to the scope of the present disclosure.

It will be further understood that the term "include" and/or "comprise" used in this specification, specify the presence of stated features, integers, steps, operations, elements, or components, but do not preclude the presence or addition of one or more other features, integers, steps, operations, elements, components, and/or groups thereof.

It will be understood that, although the terms "first", "second", etc. may be used herein to describe various elements and/or components, these elements and/or components should not be limited by these terms. These terms are only used to distinguish one element or component from other elements or components.

With respect to the terms used herein, the general terms which are currently and widely used are selected in consideration of functions of structural elements in the various embodiments of the present disclosure. However, meanings of the terms may be changed according to intention of one of ordinary skill in the art, a judicial precedence, the appearance of new technology, and the like. In addition, in certain cases, a term which is not commonly used may be selected. In such a case, the meaning of the term will be described in detail at the corresponding portion in the description of the present disclosure. Therefore, the terms used in the various embodiments of the present disclosure should be defined based on the meanings of the terms and the descriptions provided herein.

The present embodiments relate to aerosol generating device and method, and detailed descriptions of matters well known to one of ordinary skill in the art to which the following embodiments pertain will be omitted.

Figure 1:
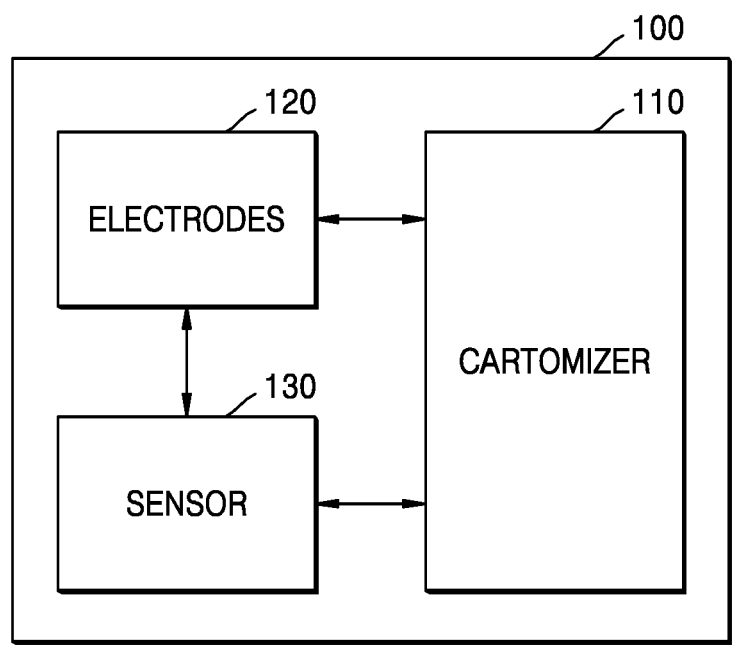
FIG. 1 is a block diagram illustrating an example of an aerosol generating device.

FIG. 1 is a block diagram illustrating an example of an aerosol generating device.

Referring to FIG. 1, an aerosol generating device 100 may include a cartomizer 110, at least one pair of electrodes 120, and a sensor 130. However, the aerosol generating device 100 is not limited thereto and may further include other general-purpose elements in addition to the elements illustrated in FIG. 1.

The cartomizer 110 may include a cartridge 111 storing an aerosol generating material and an atomizer 112 vaporizing the aerosol generating material. The aerosol generating device 100 may generate aerosol from the aerosol generating material through the cartomizer 110. The aerosol generated by the cartomizer 110 may be delivered to a user. The cartomizer 110 may also be referred to as a vaporizer or an atomizer.

The aerosol generating material may include a liquid composition and an aerosol forming substance. The liquid composition may be a liquid including a tobacco-containing material having a volatile tobacco flavor component or a liquid including a non-tobacco material. For example, the liquid composition may include water, a solvent, ethanol, plant extract, spices, flavorings, or a vitamin mixture. The spices may include menthol, peppermint, spearmint oil, and various fruit-flavored ingredients, and the flavorings may include ingredients capable of providing various flavors or tastes to a user. The vitamin mixture may be a mixture of at least one of vitamin A, vitamin B, vitamin C, and vitamin E but is not limited thereto.

The aerosol forming substance may increase the amount of the aerosol provided from the aerosol generating device 100. For example, the aerosol forming substance may include at least one of glycerin, propylene glycol, ethylene glycol, dipropylene glycol, diethylene glycol, triethylene glycol, tetraethylene glycol, and oleyl alcohol but is not limited thereto. Also, the aerosol forming substance may include other additives, such as flavors, a wetting agent, and/or organic acid and may further include a flavored liquid, such as menthol or a moisturizer.

The cartridge 111 may store the aerosol generating material. When puffing on the aerosol generating device 100 is performed, the aerosol generated from the aerosol generating device 100 may be delivered to the user. Therefore, the aerosol generating material stored in the cartridge 111 may be consumed, and thus, an amount of the aerosol generating material remaining in the cartridge 111 may be reduced.

As the remaining amount of the aerosol generating material is changed, a heating characteristic for vaporizing the aerosol generating material may need to be also changed. Also, when the remaining amount of the aerosol generating material is insufficient, the provision of the aerosol may be stopped during smoking or aerosol may not be generated from the aerosol generating device 100. Therefore, the amount of the aerosol generating material remaining inside the cartridge 111 may need to be detected. The cartridge 111 may be formed to be attached to and detached from the cartomizer 110 or may be formed integrally with the cartomizer 110.

The cartridge 111 may be manufactured in various shapes. The cartridge 111 may include an internal space for storing a liquid aerosol generating material and wall surfaces forming the internal space. For example, the cartridge 111 may have a pillar shape having an internal space formed of a bottom surface, a ceiling surface, and sides. However, the cartridge 111 is not limited to the shape described above and may be embodied in other shapes capable of storing a liquid aerosol generating material.

The atomizer 112 may vaporize the aerosol generating material. The atomizer 112 may vaporize the aerosol generating material by heating the aerosol generating material stored in the cartridge 111. For example, the atomizer 112 may transfer the aerosol generating material to the outside of the cartridge 111 and heat the aerosol generating material transferred to the outside.

The atomizer 112 may include a liquid delivery element and a heating element. The liquid delivery element may an element for transferring the aerosol generating material to the outside of the cartridge 111, and the heating element may be an element for heating the aerosol generating material delivered to the outside of the cartridge 111 by the liquid delivery element. For example, the liquid delivery element may be a wick that transfers the aerosol generating material to the outside of the cartridge 111, and the heating element may be a coil that heats the aerosol generating material transferred along the wick.

In detail, the wick may be at least one of cotton fiber, ceramic fiber, glass fiber, and porous ceramic that transfer an aerosol generating material through a capillary phenomenon, and the coil may be arranged to be wound around the wick and may include a conductive filament such as nichrome wire that generates heat by supplied current. However, embodiments are not limited thereto.

The cartomizer 110 may be detached from the aerosol generating device 100. The cartomizer 110 may be coupled to the aerosol generating device 100 to generate aerosol and may be detached from the aerosol generating device 100. For example, the cartomizer 110 may be a consumable that may be periodically replaced as the aerosol generating device 100 is used. When all the aerosol generating material stored in the cartridge 111 of the cartomizer 110 is consumed, the cartomizer 110 may be replaced by the user.

The electrodes 120 may form at least one pair. A pair may refer to two electrodes in which a first electrode and a second electrode are paired. The electrodes 120 may be arranged such that every two electrodes form a pair as a unit. For example, for a natural number n, the electrodes 120 may include n pairs formed of 2n electrodes. The electrodes 120 may be two electrodes forming one pair or 2n electrodes forming n pairs. In more detail, the electrodes 120 may be formed of pairs less than or equal to 16. Alternatively, the electrodes 120 may be formed of four pairs.

The electrodes 120 may be arranged in positions contacting one side of the cartridge 111. The electrodes 120 may be located to contact one of a plurality of surfaces forming the internal space of the cartridge 111. For example, when the cartridge 111 has a square pillar shape in which an internal space is formed by a bottom surface, a ceiling surface, and four sides, the electrodes 12 may be arranged to contact one of the four sides of the square pillar.

As the electrodes 120 are arranged to contact only one side of the cartridge 111, a design of the aerosol generating device 100 and arrangement of elements within the aerosol generating device 100 may be easier than when the electrodes 120 are arranged to contact a plurality of surfaces of the cartridge 111. Also, since the electrodes 120 are arranged to contact one of the sides other than the bottom surface or the ceiling surface of the cartridge 111, changes in the remaining amount of the aerosol generating material along the side of the cartridge 111 may be detected by the electrodes 120.

The electrodes 120 may be attached onto an outer surface of the cartridge 111. The electrodes 120 may contact one side of the cartridge 111 from the outside of the cartridge 111. However, the electrodes 120 are not limited thereto and, as needed, may also be manufactured together with the cartridge 111 in a manner that the electrodes 120 are arranged on one side in the cartridge 111.

The aerosol generating device 100 may include an accommodation space accommodating the cartomizer 110, and the electrodes 120 may be arranged on an inner surface of the accommodation space. As one side of the cartridge 111 may contact the electrodes 120 inside the aerosol generating device 100, the one side of the cartridge 111 may refer to a side of the cartridge 111 contacting the inner surface of the accommodation space. Therefore, since the electrodes 120 may be located between the one side of the cartridge 120 and the inner surface of the accommodation space, the electrodes 120 may contact the one side of the cartridge 111 and at the same time contact the inner surface of the accommodation space. A detailed example of an arrangement relationship among the accommodation space accommodating the cartomizer 110, at least one pair of electrodes 120, and one side of the cartridge 111 will be described later with reference to FIGS. 3A through 6 and 10.

The sensor 130 may measure capacitance of the electrodes 120 to detect the remaining amount of the aerosol generating material. Two electrodes forming a pair may operate as a capacitor by respectively storing electric charges of opposite signs. Capacitance of two electrodes forming a pair may be determined according to permittivity of a material located in a space between the two electrodes forming the pair.

The sensor 130 may provide information about permittivity of materials located in the vicinity of the electrodes 120 by measuring capacitance of each pair constituting at least one pair of electrodes 120. From the information about the permittivity, it may be determined whether the aerosol generating material is filled in the vicinity of the electrodes 120 or whether an empty space is formed, and the remaining amount of the aerosol generating material may be detected therefrom.

The vicinity of the electrodes 120 may refer to the vicinity of at least one pair constituting the electrodes 120. The vicinity of a pair formed of a first electrode and a second electrode may refer to not only a space formed between the first electrode and the second electrode, but also a space extending from the corresponding space to a preset range. A detailed example of the vicinity of the electrodes 120 or the vicinity of the pair will be described later with reference to FIG. 2.

To measure capacitance of the pair formed of the first electrode and the second electrode, the sensor 130 may apply a current to one of the first electrode and the second electrode and then measure a current returned from the other one of the first electrode and the second electrode. The sensor 130 may derive the capacitance of the pair formed of the first electrode and the second electrode by using a relationship between both the currents. The sensor 130 may be connected to the first electrode and the second electrode by a conducting wire to exchange currents with the first electrode and the second electrode.

The sensor 130 may include at least one channel. The at least one channel may be formed inside the sensor 130 such that capacitance of at least one pair constituting the electrodes 120 may be measured in parallel. To this end, the number of at least one channel included in the sensor 130 may correspond to the number of at least one pair constituting the electrodes 120. A detailed example of the sensor 130 will be described later with reference to FIG. 6.

The capacitance of the electrodes 120 arranged in positions contacting one side of the cartridge 111 may be measured by the sensor 130, and the remaining amount of the aerosol generating material may be detected from the capacitance of the electrodes 120. Therefore, since information about the remaining amount may be provided to the user, convenience may be increased. Also, since power supplied to the atomizer 112 may be controlled according to the remaining amount, the aerosol may be uniformly provided from the aerosol generating device 100, thereby improving smoking quality.

Figure 2:
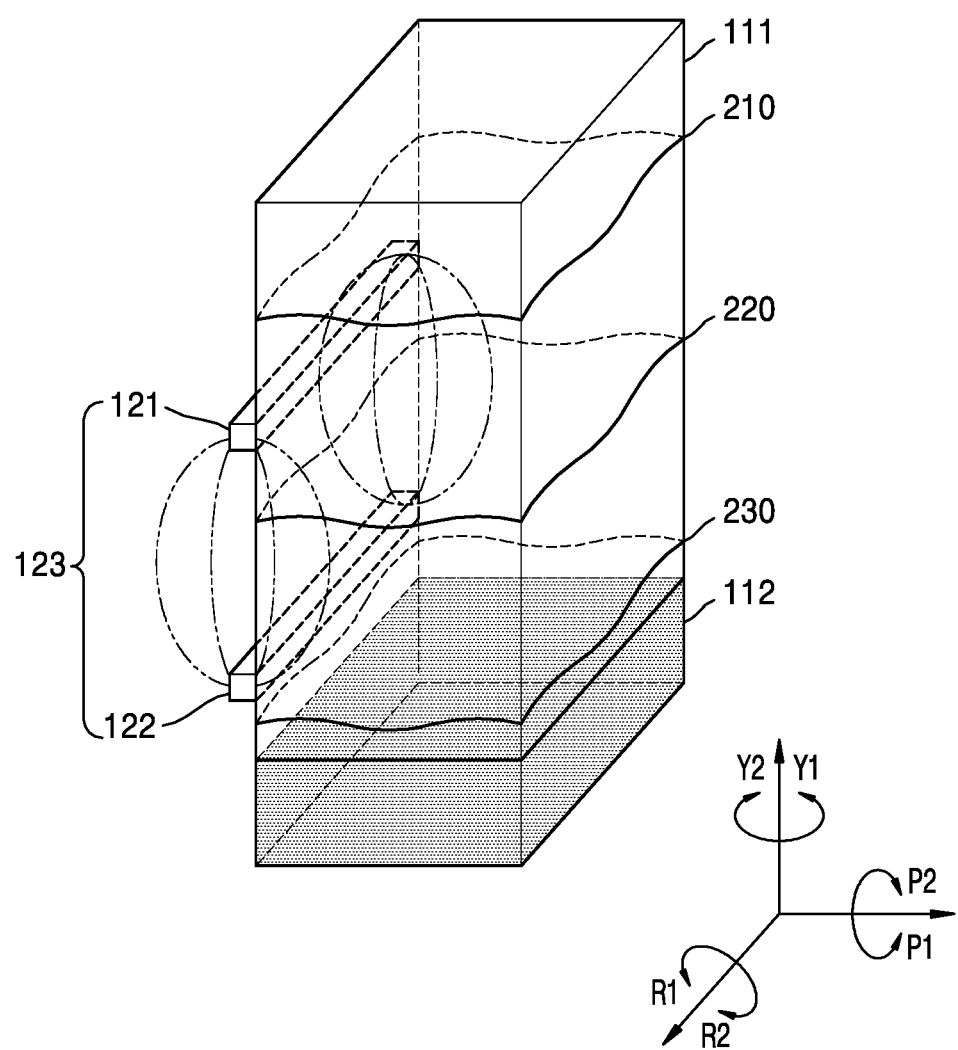
FIG. 2 is a view for explaining an example of a method of determining capacitance of at least one pair of electrodes.

FIG. 2 is a view for explaining an example of a method of determining capacitance of at least one pair of electrodes.

Referring to FIG. 2, a first electrode 121 and a second electrode 122 constituting one pair 123 may be arranged in positions contacting a side of a cartridge 111. FIG. 2 illustrates an example in which the electrodes 120 are electrodes of the one pair 123. However, even when the electrodes 120 are a plurality of pairs, the following descriptions may be applied to each of the plurality of pairs.

Capacitance of the pair 123 formed of the first electrode 121 and the second electrode 122 may be determined by materials located near the first electrode 121 and the second electrode 122. In particular, the capacitance of the pair 123 may be determined according to a remaining amount level of an aerosol generating material stored in the cartridge 111.

The first electrode 121 and the second electrode 122 may be located outside the cartridge 111, and the aerosol generating material may be located inside the cartridge 111. Nevertheless, as in the example illustrated in FIG. 2, a material located near the pair 123 formed of the first electrode 121 and the second electrode 122 may affect the capacitance of the pair 123. Therefore, the capacitance of the pair 123 may be determined according to the remaining amount level of the aerosol generating material stored in the cartridge 111.

The capacitance of the pair 123 may be determined by permittivity of materials located in the vicinity of the pair 123 or in the vicinity of the first electrode 121 and the second electrode 122. The vicinity of the pair 123 may refer to not only a space formed between the first electrode 121 and the second electrode 122, but also a space extending from the corresponding space to a preset range. As in the example illustrated in FIG. 2, the vicinity of the pair 123 may include an area that is indicated by curved lines connecting the first electrode 121 and the second electrode 122, and the aerosol generating material inside the cartridge 111 may be located within the vicinity of the pair 123.

Permittivity of a particular material may refer to a ratio of a permittivity constant of the particular material to a permittivity constant of a vacuum. When a material having high permittivity is located in the vicinity of the first electrode 121 and the second electrode 122, the capacitance of the pair 123 may be great. When a material having low permittivity is located in the vicinity of the first electrode 121 and the second electrode 122, the capacitance of the pair 123 may be small.

The capacitance of the pair 123 may be determined by an amount of the aerosol generating material remaining near the first electrode 121 and the second electrode 122. As smoking for the aerosol generating device 100 progresses, the aerosol generating material is consumed, and thus, the remaining amount of the aerosol generating material may decrease. Therefore, an empty space or an air layer may be formed inside the cartridge 111 as much as the amount of the aerosol generating material is consumed.

For example, at room temperature and atmospheric pressure, permittivity of air may be about 1.0006, and permittivity of pure water may be about 80.4. The aerosol generating material may be a solution in which various materials are resolved in water or other liquid solvents and thus may also have relatively higher permittivity than air. Therefore, as a proportion of the remaining aerosol generating material to the empty space or the air layer increases near the first electrode 121 and the second electrode 122, the capacitance of the pair 123 may increase.

Referring to the example of FIG. 2, when the remaining amount of the aerosol generating material corresponds to a remaining amount level 210, the pair 123 may have high capacitance C1. When the remaining amount of the aerosol generating material corresponds to a remaining amount level 230, the pair 123 may have low capacitance C3. When the remaining amount of the aerosol generating material corresponds to a remaining amount level 220, the pair 123 may have capacitance C2 having a value between the capacitance C1 and the capacitance C3. As such, a remaining amount of the aerosol generating material compared to the empty space or the air layer near the first electrode 121 and the second electrode 122 may be determined. For example, a correspondence relationship between the remaining amount of the aerosol generating material and the capacitance of the pair 123 may be established in advance, and the measured capacitance of the pair 123 may be converted into the remaining amount of the aerosol generating material according to the correspondence relationship.

Therefore, an amount of the aerosol generating material remaining around the pair 123 may be derived by the capacitance of the pair 123. Also, when two or more pairs are arranged in positions contacting one side of the cartridge 111, whether or not the aerosol generating material remains at portions of the cartridge 111 respectively corresponding to the positions of the pairs may be determined. Therefore, a remaining amount of the aerosol generating material may be detected from capacitance of at least one pair of electrodes 120.

As described above, the remaining amount of the aerosol generating material may be detected from a degree to which the aerosol generating material remains near each of at least one pair constituting the electrodes 120. However, embodiments are not limited thereto. For example, the remaining amount of the aerosol generating material may be detected by a sum of at least one capacitance measured from at least one pair of electrodes 120. When a remaining amount level of the aerosol generating material is high, a sum of capacitance may be large. When the remaining amount level of the aerosol generating material is low, the sum of the capacitance may be small. Therefore, the remaining amount of the aerosol generating material may be detected by a sum of capacitance.

By utilizing the sum of the capacitance, the remaining amount of the aerosol generating material may be prevented from being measured as a value different from an actual level by a tilt of the cartridge 111. FIG. 2 illustrates only one pair 123. However, in a case where there are a plurality of pairs, even if the cartridge 111 is tilted in one of pitch directions P1 and P2 of FIG. 2, a sum of the capacitance of the plurality of pairs may be kept relatively constant, although capacitance of each pair may be changed. Thereby, an error due to the tilt of the cartridge 111 may be prevented.

When the cartridge 111 rotates in one of yaw directions Y1 and Y2 of FIG. 2, the aerosol generating material inside the cartridge 111 may not be tilted, and the capacitance of the electrodes 120 may be equally measured, and thus, an additional correction of the remaining amount of the aerosol generating material may not be needed.

However, when the cartridge 111 is tilted in a roll direction R1 of FIG. 2, the capacitance of the electrodes 120 may be measured as being greater. When the cartridge 111 is tilted in a roll direction R2 of FIG. 2, the capacitance of the electrodes 120 may be measured as being smaller. Therefore, a tilt measurement element may be needed to determine whether or not the cartridge 111 is tilted in the roll directions R1 and R2 of FIG. 2. A remaining amount of the aerosol generating material derived from capacitance of the electrodes 120 may be corrected through the tilt measurement element. The tilt measurement element will be described later with reference to FIGS. 4A and 5. The method of correcting the remaining amount on the basis of the measured tilt will be described later with reference to FIG. 9.

Figure 3A:
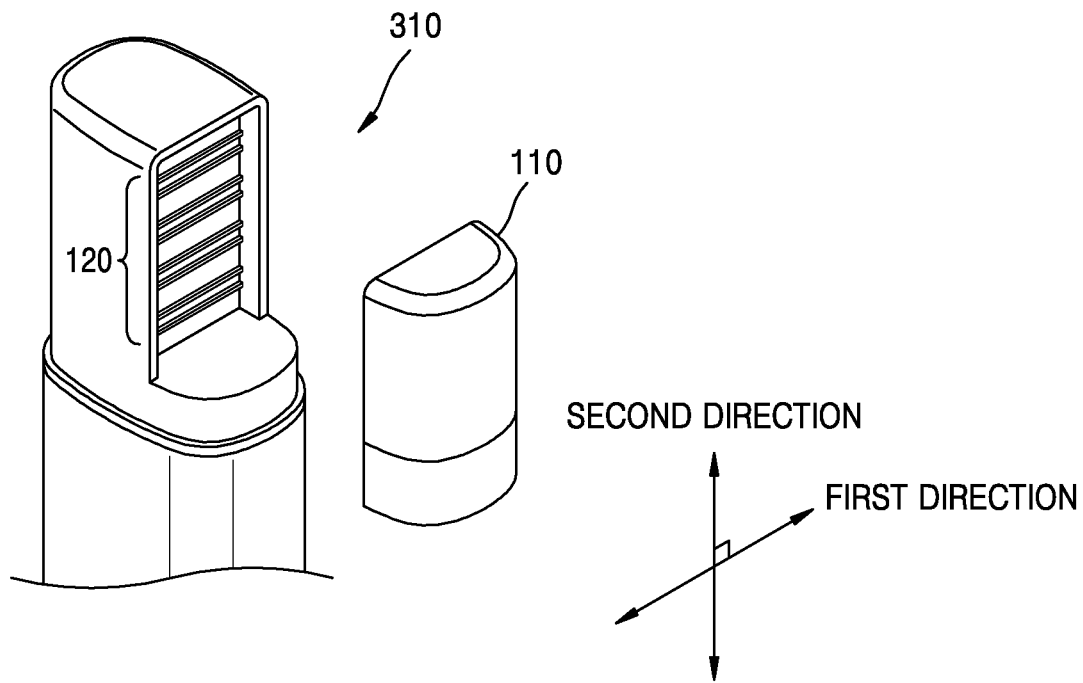
FIGS. 3A and 3B are views illustrating an example of a method of arranging at least one pair of electrodes.
Figure 3B:
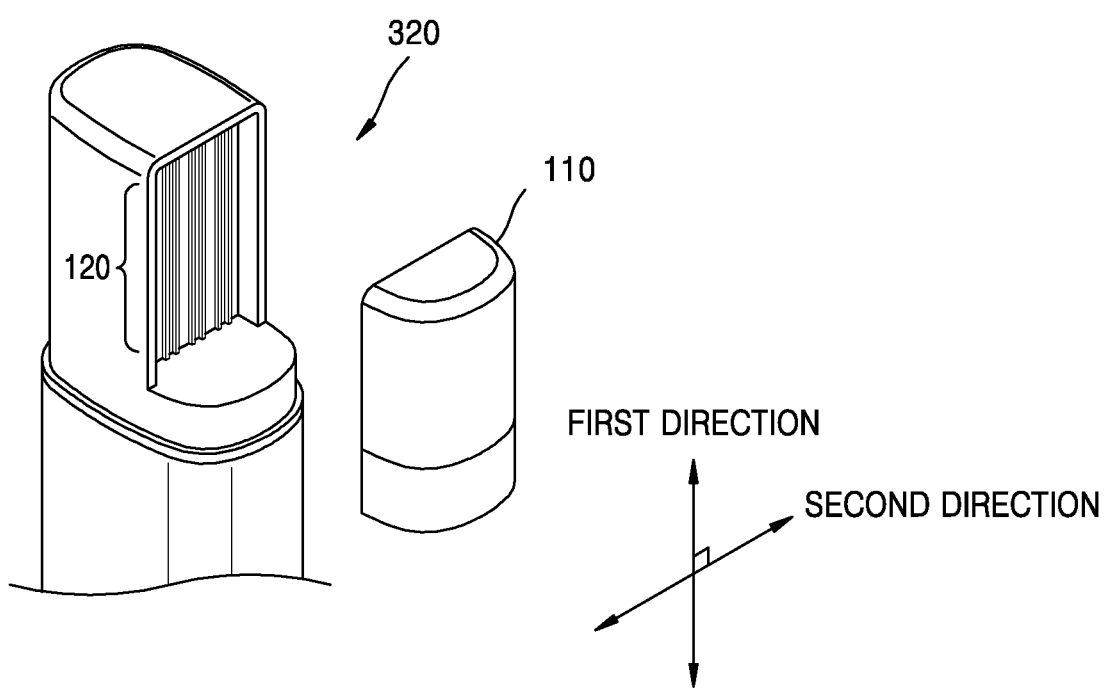

FIGS. 3A and 3B are views illustrating an example of a method of arranging at least one pair of electrodes.

FIG. 3A illustrates an aerosol generating device 310 according to an example of a method of arranging electrodes 120, and FIG. 3B illustrates an aerosol generating device 320 according to an example of a method of arranging electrodes 120.

The electrodes 120 may have elongated shapes extending in a first direction of one side of a cartridge 111, and may be arranged in a second direction of the one side of the cartridge 111. The first direction and the second direction may be orthogonal to each other. When the electrodes 120 extend in the first direction and are arranged in the second direction, the arrangements of the electrode 120 may be simplified, and one side of the cartridge 111 may be fully covered with the electrodes 120. However, in addition to the elongated shapes, the electrodes 120 may have other shapes having capacitance that is changed by a remaining amount of an aerosol generating material inside the cartridge 111.

In the case of the aerosol generating device 310 of FIG. 3A, the first direction of the one side of the cartridge 111 may refer to a transverse direction or a horizontal direction, and the second direction of the one side of the cartridge 111 may refer to longitudinal direction or a vertical direction.

The electrodes 120 may have elongated shapes extending in the transverse direction and may be arranged in the longitudinal direction.

In the case of the aerosol generating device 320 of FIG. 3B, the first direction of the one side of the cartridge 111 may refer to a longitudinal direction or a vertical direction, and the second direction of the one side of the cartridge 111 may refer to a transverse direction or a horizontal direction. The electrodes 120 may have elongated shapes extending in the longitudinal direction and may be arranged in the transverse direction.

Figure 4A:
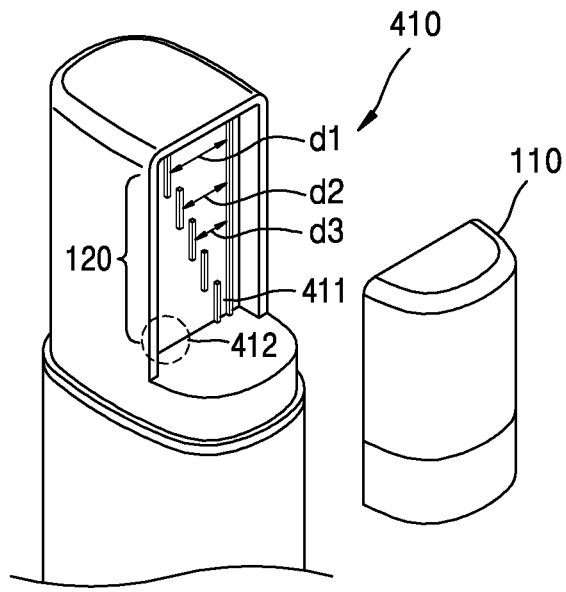
FIGS. 4A and 4B are views illustrating another example of a method of arranging at least one pair of electrodes.
Figure 4B:
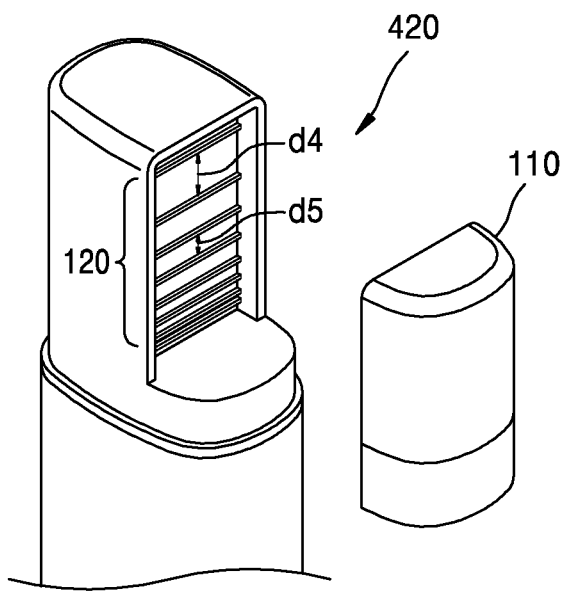

FIGS. 4A and 4B are views illustrating another example of a method of arranging at least one pair of electrodes.

FIG. 4A illustrates an aerosol generating device 410 according to another example of a method of arranging electrodes 120, and FIG. 4B illustrates an aerosol generating device 420 according to another example of a method of arranging the electrodes 120.

In the electrodes 120, a distance between two electrodes constituting each pair may vary. As such, it may be detected whether or not an aerosol generating material exists in a particular position of each pair. In addition to the examples illustrated in FIGS. 4A and 4B, whether or not the cartridge 111 is tilted in a particular direction may be determined by arranging the electrodes 120 to have different distances.

In the case of the aerosol generating device 410 of FIG. 4A, at least one pair constituting the electrodes 120 may be arranged to detect a remaining amount of the aerosol generating material at various portions of the cartridge 111. To this end, as in the example illustrated in FIG. 4A, in the electrodes 120, a distance between two electrodes constituting each pair may be different. Two electrodes constituting each pair may keep a distance d1 on an upper portion of an inner surface contacting the cartridge 111, and a distance between two electrodes may be narrowed downwards, as indicated by a distance d2 or a distance d3. Therefore, it may be detected whether or not the aerosol generating material remains near an end of a lower portion other than the entire lower portion.

Also, the electrodes 120 may be arranged in positions for detecting a tilt of the cartridge 111. For example, FIG. 4A illustrates that a pair is arranged only at one end 411 of the lower portion of the inner surface contacting the cartridge 111, but two pairs may be arranged at the one end 411 and the other end 412 of the lower portion, respectively. In this case, when capacitance of the pairs is measured differently at the one end 411 and the other end 412, a tilt of the cartridge 111 may be detected.

In the case of the aerosol generating device 420 of FIG. 4B, the electrodes 120 may have elongated shapes extending in a transverse direction and may be arranged in a longitudinal direction. Also, in the electrodes 120, a distance between two electrodes constituting each pair may be different. As in the example illustrated in FIG. 4B, two electrodes constituting each pair may have a great distance d4 in an upper portion of the cartridge 111, and two electrodes constituting each pair may be separated by a small distance, such as a distance d5. When a remaining amount level of the aerosol generating material is low, the aerosol generating material may remain in the lower portion of the cartridge 111. The electrodes 120 may be more densely arranged in the lower portion of the cartridge 111, and thus, a remaining amount of the aerosol generating device may be more elaborately measured when the remaining amount level is low.

Figure 5:
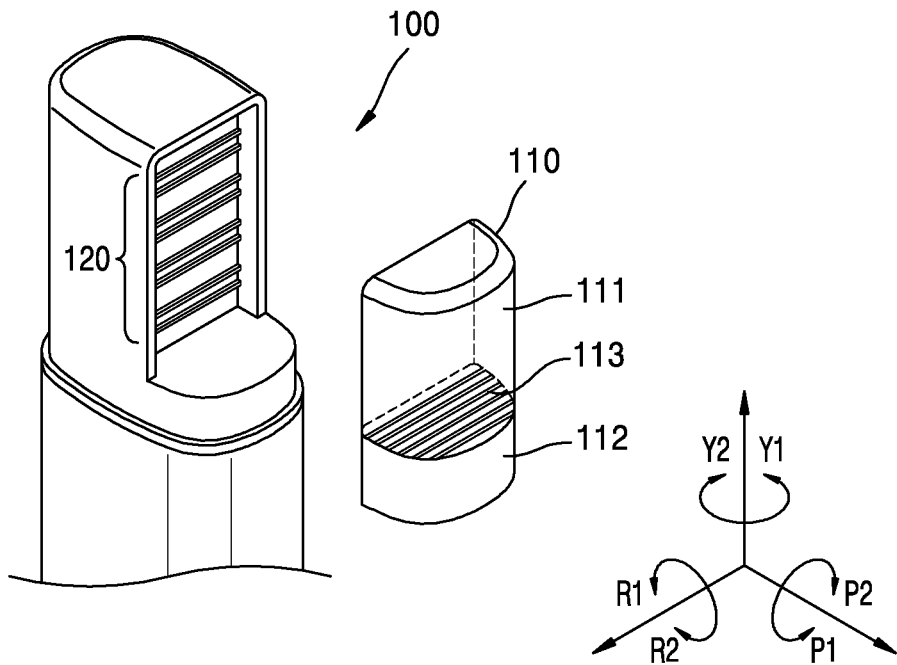
FIG. 5 is a view illustrating an example of at least one pair of bottom electrodes.

FIG. 5 is a view illustrating an example of at least one pair of bottom electrodes.

Referring to FIG. 5, a cartomizer 110 may further include at least one pair of bottom electrodes 113 arranged on a bottom surface of a cartridge 111. The bottom electrodes 113 may be located between the cartridge 111 and an atomizer 112, and capacitance of each pair constituting the bottom electrodes 113 may be measured by the sensor 130.

When the cartomizer 110 further includes the bottom electrodes 113, whether or not the cartridge 111 is tilted may be detected based on capacitance of the bottom electrodes 113. In particular, whether or not the cartridge 111 is tilted in roll directions R1 and R2 may be detected from the bottom electrodes 113.

For example, when the cartomizer 110 is tilted in the roll directions R1 and R2, some of the bottom electrodes 113 may not detect an aerosol generating material and thus may have low capacitance. Therefore, whether or not the cartridge 111 is tilted in the roll directions R1 and R2 may be determined through analysis of the capacitance of the bottom electrodes 113. Also, with more than a preset number of bottom electrodes 113, a degree to which the cartridge 111 is tilted in the roll directions R1 and R2 may be also determined.

If a remaining amount level is low, the aerosol generating material may not remain near the bottom electrodes 113 even at a small tilt. If the remaining amount level is higher than or equal to a preset level, all the bottom electrodes 113 may detect the aerosol generating material even when a slight tilt occurs. Therefore, as the remaining amount level is lower, a tilt may also be more elaborately detected. As a result, in terms of tilt correction, a small remaining amount of the aerosol generating material may be more elaborately measured.

As described above, whether or not the cartridge 111 is tilted in various directions and a degree to which the cartridge 111 is tilted may be determined according to the arrangement of electrodes. If a tilt of the cartridge 111 is detected, a remaining amount of the aerosol generating material may be more accurately measured on the basis of the tilt. For example, as illustrated in FIG. 5, if a tilt of the cartridge 111 in the roll direction R1 is detected, the remaining amount of the aerosol generating material may be corrected to be lower than a value detected from capacitance of the electrodes 120. If a tilt of the cartridge 111 in the roll direction R2 is detected, the remaining amount of the aerosol generating material may be corrected to be higher than the value detected from the capacitance of the electrodes.

The tilt of the cartridge 111 may be detected by an additional element of the aerosol generating device 100. As an example, the aerosol generating device 100 may further include a storage device such as a memory, and the memory may be formed integrally with a processing device such as a processor. When the aerosol generating device 100 further includes a memory, a remaining amount of the aerosol generating material may be accumulated and recorded in the memory according to the cumulative use of the aerosol generating device 100. The remaining amount of the aerosol generating material may decrease as the use of the aerosol generating device 100 continues. Therefore, when the remaining amount of the aerosol generating material is detected as having increased, it may be determined that a tilt has occurred. As another example, the aerosol generating device 100 may further include a gyro sensor for measuring a tilt. In this case, tilt information of the cartridge 111 may be provided from the gyro sensor, and the remaining amount of the aerosol generating material may be corrected according to the tilt information.

Figure 6:
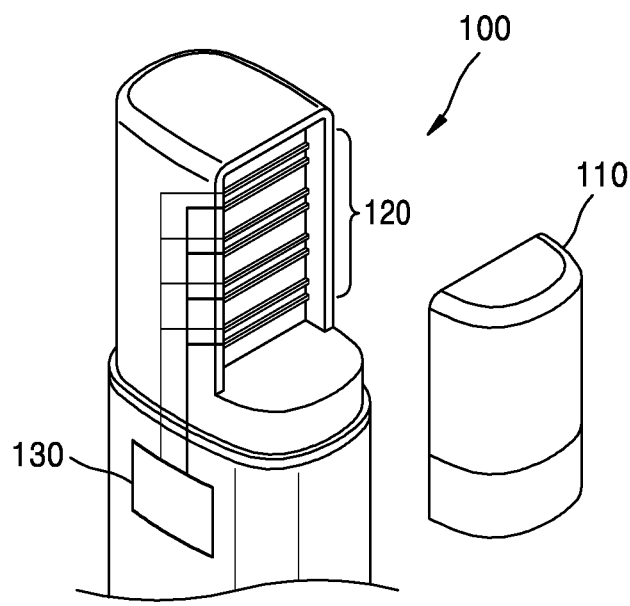
FIG. 6 is a view illustrating an example of a sensor measuring capacitance of at least one pair of electrodes.

FIG. 6 is a view illustrating an example of a sensor measuring capacitance of at least one pair of electrodes.

Referring to FIG. 6, a sensor 130 may be connected to electrodes 120 to measure capacitance of the electrodes 120. As described above, the sensor 130 may be a multi-channel sensor having channels respectively corresponding to the pairs of the electrodes 120. The sensor 130 may include at least one channel formed therein for measuring, in parallel, capacitance of at least one pair constituting the electrodes 120.

The sensor 130 may be connected to each of at least one pair included in the electrodes 120. The sensor 130 may be connected to each pair through a current transmission line and a current reception line. At least one channel of the sensor 130 may be respectively connected to at least one pair constituting the electrodes 120.

When a cartomizer 110 further includes the bottom electrodes 113, the sensor 130 may include a first sensor measuring capacitance of the electrodes 120 and a second sensor measuring capacitance of the bottom electrodes 113. When the sensor 130 includes the first sensor and the second sensor, the first sensor may be used to detect a remaining amount of an aerosol generating material, and the second sensor may be used to detect a tilt of the cartridge 111.

Figure 7:
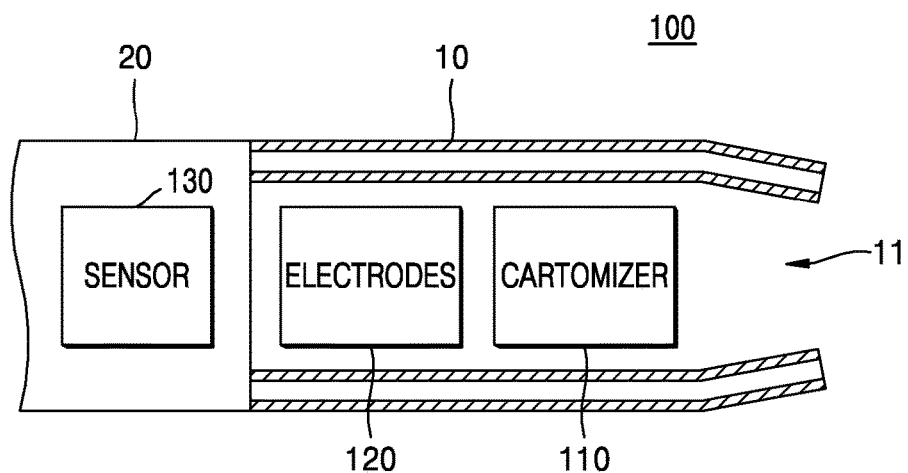
FIG. 7 is a diagram for explaining an example of a method of arranging elements of an aerosol generating device.

FIG. 7 is a diagram for explaining an example of a method of arranging elements of an aerosol generating device.

Referring to FIG. 7, an aerosol generating device 100 may include a lower device portion 20 and an upper device portion 10. The lower device portion 20 may include a sensor 130, and the upper device portion 10 may include a cartomizer 110 and electrodes 120. However, the arrangement of the elements is not limited to the above positions, and the positions in which the elements of the aerosol generating device 100 are arranged may be changed as needed.

The lower device portion 20 may include electronic elements that perform operations for generating aerosol from the aerosol generating device 100. Therefore, the lower device portion 20 may further include other electronic components in addition to the sensor 130.

The upper device portion 10 may include elements involved in the generation of the aerosol. The upper device portion 10 may include the cartomizer 110 such that the aerosol may be generated from the upper device portion 10. Also, the upper device portion 10 may include a mouthpiece 11 for delivering the aerosol to a user. The user may puff the aerosol from the upper device portion 10 through the mouthpiece 11. Also, the electrodes 120 arranged in positions contacting one side of the cartridge 111 may be located in the upper device portion 10 together with the cartridge 111.

The upper device portion 10 may further include an accommodation space for accommodating a cigarette and a heater for heating the cigarette accommodated in the accommodation space. In this case, an aerosol generated from the cartomizer 110 may be delivered to the user through the cigarette accommodated in the accommodation space.

Figure 8:
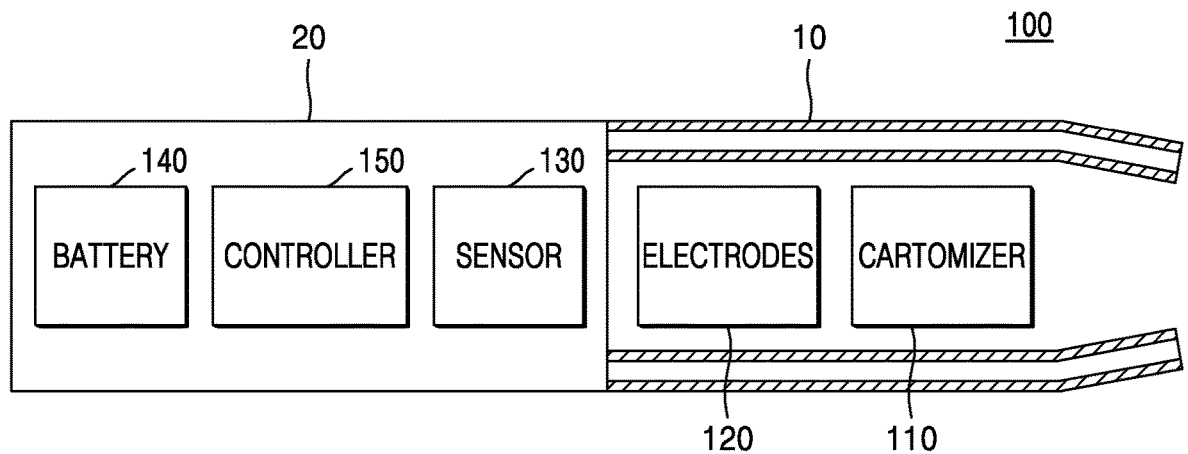
FIG. 8 is a block diagram illustrating an example of an aerosol generating device further including a battery and a controller.

FIG. 8 is a block diagram illustrating an example of an aerosol generating device further including a battery and a controller.

Referring to FIG. 8, an aerosol generating device 100 may further include a battery 140 and a controller 150. The battery 140 and the controller 150 included in the aerosol generating device 100 may be included in a lower device portion 20. However, the arrangement of the elements is not limited to the above positions, and the positions in which the elements included in the aerosol generating device 100 are arranged may be changed according to a design. Also, the aerosol generating device 100 may further include other general-purpose elements in addition to the elements illustrated in FIG. 8.

The battery 140 may be a lithium iron phosphate ($LiFePO_4$) battery but is not limited thereto. For example, the battery 140 may be a lithium cobalt oxide ($LiCoO_2$) battery, a lithium titanate battery, or the like.

The battery 140 may supply power to the atomizer 112. When the atomizer 112 includes a wick and a coil, the battery 140 may supply power to the coil wound around the wick to heat an aerosol generating material transferred along the wick. Also, the battery 140 may supply the sensor 130 and the controller 150 with power needed for the sensor 130 and the controller 150 to operate.

The controller 150 may be implemented as an array of a plurality of logic gates or may be implemented as a combination of a general-purpose microprocessor and a memory in which a program executable in the microprocessor is stored. The controller 150 may include a plurality of processing elements. Also, the controller 150 may be implemented in other forms of hardware.

The controller 150 may detect a remaining amount of the aerosol generating material from capacitance of electrodes 120 measured by the sensor 130. The controller 150 may receive data about the capacitance from the sensor 130 and derive a remaining amount level therefrom. As in the example described above, the controller 150 may determine a portion in which the aerosol generating material exists inside a cartridge 111, by each of capacitance of each pair of the electrodes 120. Alternatively, the controller 150 may derive the remaining amount level based on a sum of the capacitance of the pairs constituting the electrodes 120.

The controller 150 may detect a remaining amount of the aerosol generating material in various methods. Capacitance measurement values of the electrodes 120 respectively corresponding to the remaining amount level inside the cartridge 111 may be experimentally determined in advance, and the controller 150 may receive capacitance and output a remaining amount level, on the basis of a database regarding a correspondence relationship between the capacitance and the remaining amount level. However, the present disclosure is not limited thereto, and the controller 150 may derive a remaining amount level according to an algorithm for calculating a remaining amount level from the measured capacitance.

The controller 150 may consider a tilt of the cartridge 111 in a process of deriving the remaining amount level from the capacitance. As described above, the tilt of the cartridge 111 may be detected through the bottom electrodes 113 or the like, and the controller 150 may perform correction to increase or decrease the remaining amount level according to the tilt of the cartridge 111. Details of correcting the remaining amount of the aerosol generating material on the basis of the tilt of the cartridge 111 will be described later with reference to FIG. 9.

The aerosol generating device 100 may further include an element for measuring tilts of the aerosol generating device 100 and the cartridge 111. As described above, the aerosol generating device 100 may further include an additional memory or a gyro sensor. The controller 150 may be provided with information about tilts from the memory or the gyro sensor. The memory may accumulate and record a remaining amount of the aerosol generating material as smoking for the aerosol generating device 100 is performed. When the remaining amount recorded in the memory indicates that it has increased than at a previous time point, the controller 150 may also determine that the cartridge 111 is tilted.

The controller 150 may control power supplied from the battery 140 to the atomizer 112 on the basis of the remaining amount of the aerosol generating material. With respect to the atomizer 112 including the wick and the coil, when a remaining amount level is high, a speed at which the aerosol generating material is transferred along the wick to the outside of the cartridge 111 may be high. Also, when the remaining amount level is low, the speed at which the aerosol generating material is transferred along the wick to the outside of the cartridge 111 may be low.

Therefore, when the speed at which the aerosol generating material is transferred is high, a larger amount of power may need to be supplied to the coil. Conversely, when the speed at which the aerosol generating material is transferred is low, a smaller amount of power may need to be supplied to the coil. The speed at which the aerosol generating material is transferred may be affected by additional factors such as a temperature inside the cartridge 111.

When a power supply is controlled without considering the speed at which the aerosol generating material is transferred, aerosol may not be uniformly generated from the aerosol generating device 100. Also, when the speed at which the aerosol generating material is transferred is low, the wick may burn when supply power is not reduced, thereby causing troubles. The controller 150 may improve quality of the aerosol generated from the aerosol generating device 100 by controlling the power supplied to the coil on the basis of the remaining amount level.

Figure 9:
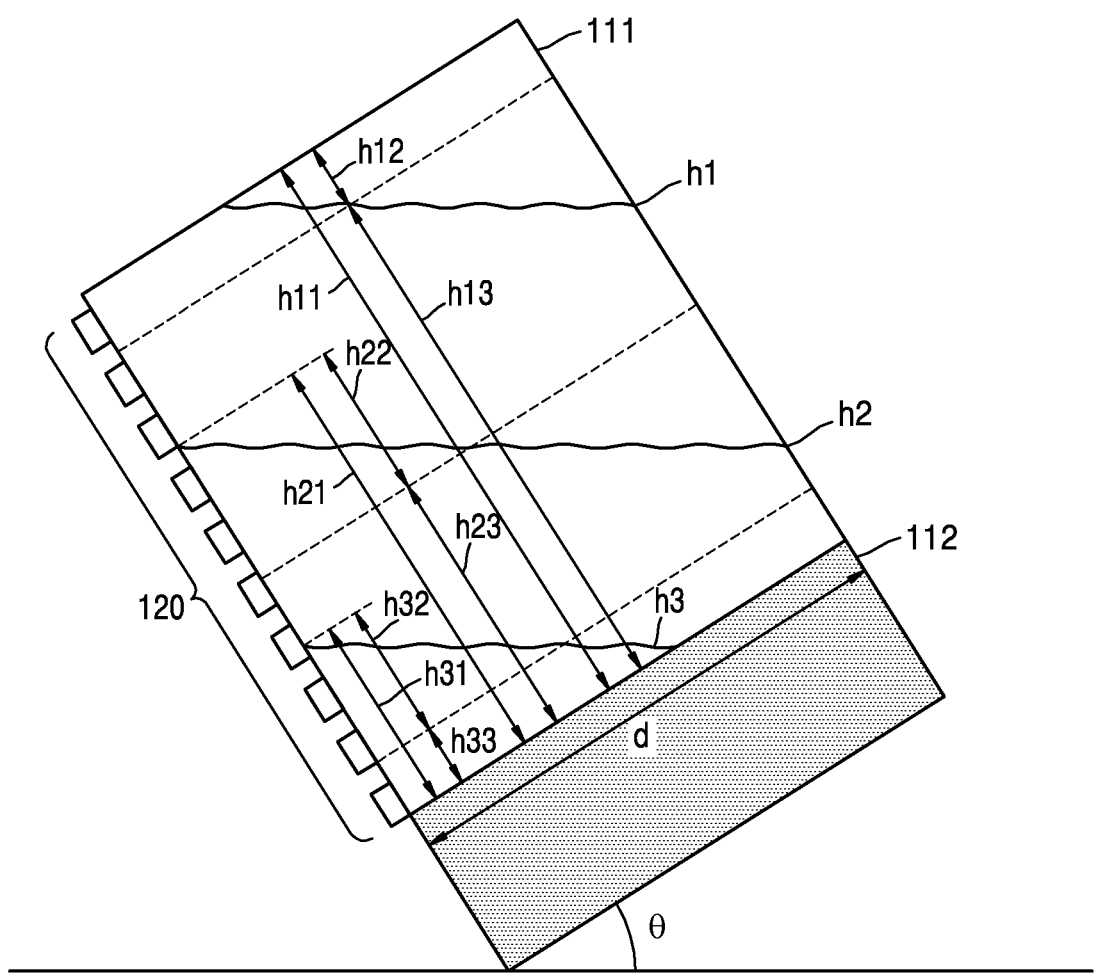
FIG. 9 is a view for explaining an example of a method of correcting a remaining amount of an aerosol generating material when a cartridge is tilted.

FIG. 9 is a view for explaining an example of a method of correcting a remaining amount when a cartridge is tilted.

FIG. 9 illustrates three examples, according to a remaining amount, in which a cartridge 111 is tilted at a preset angle $\theta$ with respect to the ground and an aerosol generating material is tilted inside the cartridge 111.

As illustrated in FIG. 9, a direction in which the cartridge 111 is tilted may be the roll direction R1 of FIG. 2 or 5. However, even when the cartridge 111 is tilted in another direction other than in the roll direction R1, the controller 150 may correct a remaining amount by a method applied to the case of the roll direction R1. The angle $\theta$ at which the cartridge 111 is tilted may be detected by the bottom electrodes 113 as described above with reference to FIG. 5. Alternatively, the angle $\theta$ may be measured by the gyro sensor further included in an aerosol generating device 100.

A remaining amount level may be expressed as a height of an aerosol generating material remaining inside the cartridge 111. A height of the aerosol generating material in the cartridge 111 may be determined from capacitance of electrodes 120 measured by the sensor 130. Referring to the example of FIG. 9, since the electrodes 120 detect the aerosol generating material located near the electrodes 120, the controller 150 may detect a remaining amount level h11 in a case of a remaining amount h1, detect a remaining amount level h21 in a case of a remaining amount h2, and detect a remaining amount level h31 in a case of a remaining amount h3.

In the case of the remaining amount h2, an actual remaining amount in the cartridge 111 may be the remaining amount level h23. Thus, the remaining amount level h22 may need to be offset. When the cartridge 111 has a width d, the remaining amount level h22 may be equal to $(d/2)*\tan \theta$. The controller 150 may correct the measured remaining amount level h21 to the remaining amount level h23. In detail, the controller 150 may derive the corrected remaining amount level h23 by subtracting $(d/2)*\tan \theta$ from the measured remaining amount level h21.

When the remaining amount h1 remains in the cartridge 111 or the remaining amount h3 remains in the cartridge 111, a method of correcting a remaining amount level may be different from the case of the remaining amount h2. For example, in the case of the remaining amount h1, a remaining amount level h12 corresponding to a difference between the measured remaining amount level h11 and an actual remaining amount level h13 may be smaller than $(d/2)*\tan \theta$. For example, the remaining amount level h12 may be equal to $(d/3)*\tan \theta$ or the like. Also, in the case of the remaining amount h3, a remaining amount level h32 corresponding to a difference between the measured remaining amount level h31 and an actual remaining amount level h33 may be greater than $(d/2)*\tan \theta$. For example, the remaining amount level h32 may be equal to $(2d/3)*\tan \theta$ or the like. Therefore, when details as described above are considered, correction of a remaining amount according to a tilt may be further elaborately performed. The controller 150 may determine a calculation formula to be used correct a remaining amount, on the basis of the angle $\theta$, the width d, a measured value of a remaining amount level, and the like.

Figure 10:
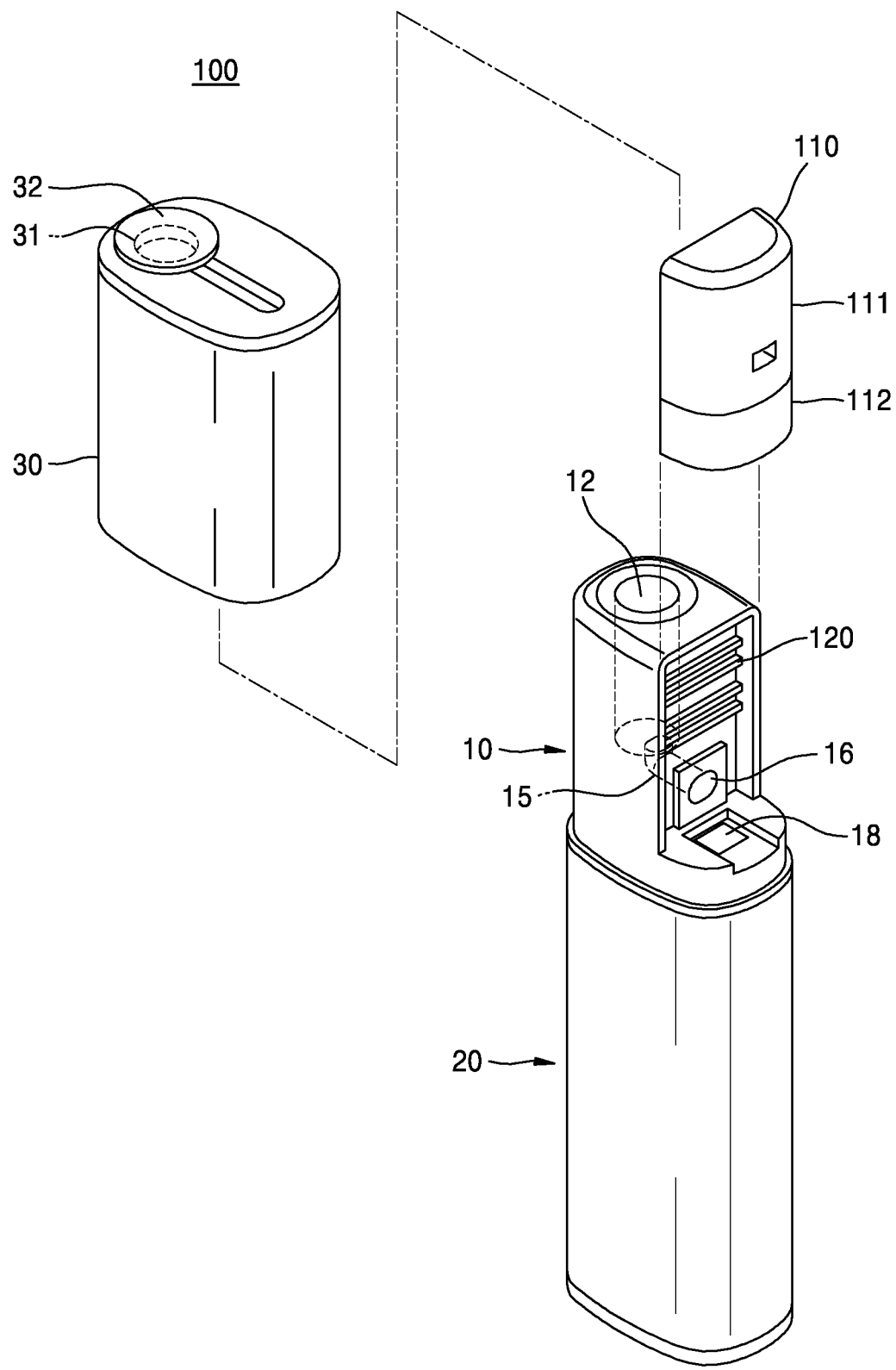
FIG. 10 is a view for explaining an example of a method in which a cartomizer is accommodated in an aerosol generating device.

FIG. 10 is a view for explaining an example of a method in which a cartomizer is accommodated in an aerosol generating device.

FIG. 10 illustrates elements included in an aerosol generating device 100 in more detail. The aerosol generating device 100 may include a lower device portion 20, an upper device portion 10, and an upper case 30.

The upper device portion 10 may accommodate a cartomizer 110. The cartomizer 110 may be accommodated in the upper device portion 10 to form a portion of an outer surface of the upper device portion 10. The cartomizer 110 may be coupled to an upper right end of the upper device portion 10 but is not limited thereto. In a position in which the cartomizer 110 is accommodated in the upper device portion 10 may be changed as needed.

The aerosol generating device 100 may be embodied to further include a cigarette in addition to the cartomizer 110. For example, the upper device portion 10 may include an accommodation portion 12 for accommodating the cigarette. The accommodation portion 12 may be a cylindrical space for accommodating the cigarette, and the upper device portion 10 may further include a heater arranged along a circumferential direction of a side of the accommodation portion 12. However, the heater is not limited thereto and may be embodied as a heater that is inserted into the cigarette to heat the cigarette.

The upper device portion 10 may further include air flow paths 15 and 16. The air flow paths 15 and 16 may be passages through which external air may be introduced into the cigarette such that aerosol may be generated from the cigarette. The air flow paths 15 and 16 may connect the cigarette and the cartomizer 110. Therefore, an aerosol generated from the cartomizer 110 may be delivered to the cigarette through the air flow paths 15 and 16. The cigarette may generate the aerosol separately from the cartomizer 110. Therefore, the aerosol generated from the cartomizer 110 may be delivered to a user through the cigarette together with the aerosol generated from the cigarette.

The upper device portion 10 may further include an electrical contact 18. The cartomizer 110 may be connected to the sensor 130, the battery 140, and the controller 150 included in the lower device portion 20 through the electrical contact 18. Power may be supplied from the battery 140 to an atomizer 112 through the electrical contact 18, and when the cartomizer 110 further includes the bottom electrodes 113, capacitance of the bottom electrodes 113 may be measured through the electrical contact 18.

The lower device portion 20 may include the sensor 130, the battery 140, the controller 150, and the like. The lower device portion 20 may be electrically connected to the cartomizer 110 through the electrical contact 18. The lower device portion 20 may further include a sensor such as a decompression sensor and may further include a tactile interface such as a vibration generating motor and a visual interface such as a display.

The upper case 30 may be coupled to the upper device portion 10. The upper case 30 may be coupled to the upper device portion 10 accommodating the cartomizer 110 to prevent the cartomizer 110 from being unintentionally detached from the aerosol generating device 100. The upper case 30 may further include a hole 31 arranged in a position corresponding to the accommodation portion 12, and a slide cover 32 capable of opening and closing the hole 31 and the accommodation portion 12.

When the aerosol generating device 100 further includes the accommodation portion 12, a heater, the air flow paths 15 and 16, and the like, the aerosol generating device 100 may generate aerosol from both the cartomizer 110 and the cigarette, and provide the aerosol to the user. Therefore, aerosol provided from the aerosol generating device 100 may be pluralized such that a flavor and a smoking impression of the aerosol may be improved.

FIG. 11 is a flowchart illustrating an example of an aerosol generating method.

Referring to FIG. 11, the aerosol generating method may include operations 1110, 1120, and 1130. The aerosol generating method is not limited to the operations illustrated in FIG. 11 and may further include other general-purpose operations in addition to the operations illustrated in FIG. 11.

The aerosol generating method of FIG. 11 may include operations that are processed sequentially in the aerosol generating device 100 of FIGS. 8 through 10. Therefore, even if omitted below, the above description of the aerosol generating device 100 of FIGS. 8 through 10 may also be applied to the aerosol generating method of FIG. 11.

In operation 1110, the aerosol generating device 100 may measure capacitance of at least one pair of the electrodes 120 arranged in positions contacting one side of the cartridge 111 storing an aerosol generating material.

In operation 1120, the aerosol generating device 100 may detect a remaining amount of the aerosol generating material from the capacitance.

In operation 1130, the aerosol generating device 100 may control power supplied to the atomizer 112 vaporizing the aerosol generating material, on the basis of the remaining amount.

The aerosol generating method of FIG. 11 may be recorded on a computer-readable recording medium recording thereon one or more programs including instructions executing the aerosol generating method.

Examples of the computer-readable recording medium may include magnetic media such as hard disks, floppy disks, and magnetic tapes, optical media such as CD-ROM and DVD, magneto-optical media such as floptical disks, and hardware devices particularly configured to store and perform program instructions, such as ROM, RAM, and flash memory. Examples of the program instructions may include high-level language codes that may be executed by a computer using an interpreter or the like as well as machine language codes made by a compiler.

Although the embodiments have been described in detail, the scope of the present disclosure is not limited to the embodiments, and various modifications and improvements made by one of ordinary skill in the art using the basic concept of the present disclosure defined in the following claims pertain to the scope of the present disclosure.

What is claimed is:

1. An aerosol generating device comprising:
 a cartomizer comprising:
  a cartridge configured to store an aerosol generating material; and
  an atomizer configured to vaporize the aerosol generating material;
 an accommodation space accommodating the cartomizer,
 at least one pair of electrodes arranged in positions contacting one side of the cartridge, the electrodes are arranged on an inner surface of the accommodation space;
 at least one pair of bottom electrodes arranged on a bottom surface of the cartridge;
 a sensor configured to measure capacitance of the electrodes and the bottom electrodes; and
 a controller configured to:
  detect the remaining amount of the aerosol generating material based on the capacitance of the electrodes; and
  correct the detected remaining amount of the aerosol generating material according to a tilt of the cartridge detected based on the capacitance of the bottom electrodes.

2. The aerosol generating device of claim 1, further comprising:
 a battery configured to supply power to the atomizer,
 wherein the controller is further configured to control the power supplied to the atomizer, based on the detected remaining amount of the aerosol generating material.

3. The aerosol generating device of claim 1 wherein the one side indicates a side of the cartridge contacting an inner surface of an accommodation space included in the aerosol generating device to accommodate the cartomizer.

4. The aerosol generating device of claim 1, wherein the cartomizer is detachable from the aerosol generating device.

5. The aerosol generating device of claim 1, wherein the electrodes have elongated shapes extending in a first direction of the one side and are arranged in a second direction of the one side,
 wherein the first direction and the second direction are orthogonal to each other.

6. The aerosol generating device of claim 1, wherein in the electrodes, distances between the two electrodes of each pair are different from each other.

7. The aerosol generating device of claim 1, wherein the electrodes comprise n pairs formed of 2n electrodes, and wherein n is a natural number.

8. The aerosol generating device of claim 1, wherein the sensor comprises at least one channel having a number corresponding to a number of the at least one pair.

9. The aerosol generating device of claim 1, wherein the atomizer comprises:
 a wick transferring the aerosol generating material outside the cartridge; and
 a coil heating the aerosol generating material transferred by the wick.

10. An aerosol generating method performed by an aerosol generating device, the method comprising:

measuring capacitance of at least one pair of electrodes arranged in positions contacting one side of a cartridge storing an aerosol generating material;

measuring the capacitance of at least one pair of bottom electrodes arranged on the bottom surface of the cartridge;

detecting a remaining amount of the aerosol generating material based on the capacitance;

correcting the detected remaining amount of aerosol generating material according to a tilt of the cartridge based on the capacitance of the bottom electrodes; and controlling, power supplied to an atomizer vaporizing the aerosol generating material based on the detected remaining amount of the aerosol generating material, wherein the aerosol generating device comprises a cartomizer comprising the cartridge and the atomizer, and an accommodation space accommodating the cartomizer, and wherein the electrodes are arranged on an inner surface of the accommodation space.

\* \* \* \* \*